US007738242B2

(12) United States Patent
McGraw et al.

(10) Patent No.: US 7,738,242 B2
(45) Date of Patent: Jun. 15, 2010

(54) SYSTEM AND METHOD FOR DISPLAYING CHASSIS COMPONENT INFORMATION

(75) Inventors: Montgomery C. McGraw, Spring, TX (US); Robert Thomas McClung, The Woodlands, TX (US); Gabriel C. Cox, The Woodlands, TX (US); Daniel W. Eaton, The Woodlands, TX (US); Jonathan Nalley, The Woodlands, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1869 days.

(21) Appl. No.: 10/754,804

(22) Filed: Jan. 8, 2004

(65) Prior Publication Data

US 2005/0195075 A1 Sep. 8, 2005

(51) Int. Cl.
*H05K 7/20* (2006.01)
(52) U.S. Cl. ............... 361/679.21; 361/724; 312/223.1; 312/223.2; 340/286.02; 340/332; 340/815.45
(58) Field of Classification Search ......... 361/679–683, 361/724–727; 312/223.1, 223.2; 340/286.02, 340/332, 815, 815.45
See application file for complete search history.

(56) References Cited

U.S. PATENT DOCUMENTS

| | | | | |
|---|---|---|---|---|
| 4,384,368 | A * | 5/1983 | Rosenfeldt et al. | 398/140 |
| 6,061,250 | A * | 5/2000 | Lavan | 361/797 |
| 6,388,878 | B1 * | 5/2002 | Chang | 361/687 |
| 6,462,670 | B1 | 10/2002 | Bolognia et al. | 340/815.45 |
| 6,741,474 | B1 * | 5/2004 | Hung et al. | 361/727 |
| 6,901,557 | B1 * | 5/2005 | Martinez et al. | 715/772 |
| 2002/0084994 | A1 * | 7/2002 | Hansen | 345/204 |
| 2003/0033546 | A1 | 2/2003 | Bresniker et al. | 713/300 |
| 2003/0140267 | A1 * | 7/2003 | Abbondanzio et al. | 714/4 |
| 2004/0176920 | A1 * | 9/2004 | Monfared et al. | 702/75 |
| 2004/0199568 | A1 * | 10/2004 | Lund | 709/201 |

OTHER PUBLICATIONS

Sun Cobalt Server Appliances, Internet publication, http://www.sun.com/hardware/serverappliances/pdfs/family.guide.pdf, 16 pages, Dec. 2001.
Anonymous, "RLX System 600ex Quick Start Poster", Internet Artcle,Online!, 2003, pp. 1-2, XP002341003, retreived from http://www.rlx.com/downloads/pdf/hardwareguides/RLXSys600exQSP.pdf, Aug. 16, 2005.
Anonymous, "RLX System 610ex/600ex Hardware Management Guide Appendix B ActivStat Basics", Internet Article, Online!, 2004, pp. B-1-B-10, XP002341004, retrieved from http://www.rlx.com/downloads/pdf/hardwareguides/RLXSys610ex-600exHWMG.pdf, Aug. 16, 2005.
Chu, F. "RLX blades fit midtier tasks", Eweek, Online!, vol. 20, No. 33, Aug. 18, 2003, p. 1, XP002341002, retrieved from http://www/rlx.com/content/resources/pdf/articles/eweek0803.pdf, Aug. 16, 2005.
Zeichick A. "*Bantom Blade Battle*", Infoworld Online!, Jul. 7, 2003, pp. 1-5, XP002341001, retrieved from http://www.rlx.com/content/resources/pdf/articles/infoworld703.pdf, Aug. 16, 2005.
Notification of Transmittal of the International Search Report and the Written Opinion of the International Searching Authority of International application No. PCT/US2005/000417, filed Jan. 6, 2005 (16 pages), Aug. 31, 2005.

\* cited by examiner

*Primary Examiner*—Jayprakash N Gandhi
*Assistant Examiner*—Anthony Q Edwards

(57) ABSTRACT

A system for displaying chassis component information includes a chassis and a plurality of server blades each coupled to the chassis. Each server blade comprises a respective liquid crystal display (LCD) positioned upon the server blade. The respective LCD is operable to display chassis component information.

60 Claims, 6 Drawing Sheets

SYSTEM AND METHOD FOR DISPLAYING CHASSIS COMPONENT INFORMATION

TECHNICAL FIELD OF THE INVENTION

The present invention relates generally to server chassis communication systems and, more particularly, to a system and method for displaying chassis component information.

BACKGROUND OF THE INVENTION

Network servers are often used for storage of information, communication and/or to provide access to communication networks including the Internet. Users of network servers are provided the ability to view, access, retrieve and/or store audio, video, data graphics and/or text files. Such files may be displayed to the user via protocols, including, without limitation, hypertext transfer protocol (HTTP). Network servers may include one or more server processing cards coupled with a server chassis. Each server processing card may include software and/or hardware components necessary to perform the functionality of a server.

Light emitting diodes (LEDs) are sometimes used to display activity information relating to the server chassis and its components. However, the density of processors within a given volume of a server chassis has increased over the years in order to meet demands for speed and processing power. Such increase limits the amount and type of information that can be easily displayed using the LEDs.

SUMMARY OF THE INVENTION

The present invention provides a system and method for displaying chassis component information that substantially eliminates or reduces at least some of the disadvantages and problems associated with previous display systems and methods.

In accordance with a particular embodiment of the present invention, a system for displaying chassis component information includes a chassis and a plurality of server blades each coupled to the chassis. Each server blade comprises a respective liquid crystal display (LCD) positioned upon the server blade. The respective LCD is operable to display chassis component information.

The chassis component information may comprise server blade information of the server blade upon which the respective LCD is positioned. The server blade information may comprise network configuration information. The respective LCD may be operable to display chassis component information in color to indicate a message. The chassis component information may comprise chassis component activity information.

Each server blade may further comprise at least one respective control key associated with the respective LCD. The at least one respective control key may be operable to provide operational control of at least one chassis component. The at least one chassis component may comprise the server blade of the at least one respective control key. The operational control may comprise setup control or power control of the server blade of the at least one respective control key. Each server blade may further comprise a respective management processor operable to drive the respective LCD. The management processor may be operationally distinct from a main processor of the server blade such that the main processor may be inactive during operation of the respective LCD.

In accordance with another embodiment, a system for displaying chassis component information includes a chassis and a chassis blade coupled to the chassis. The chassis blade comprises an LCD positioned upon the chassis blade. The LCD is operable to display chassis component information.

The chassis blade may comprise a chassis management blade operable to manage switch fabric of the chassis. The chassis component information may comprise chassis component activity information or network configuration information. The chassis management blade may further comprise at least one control key associated with the LCD. The at least one control key may be operable to provide operational control of at least one chassis component. The operational control may comprise setup control or power control of at least one chassis component. The chassis blade may comprise a network interface card.

Technical advantages of particular embodiments of the present invention include a plurality of server blades each having a respective LCD for displaying server blade and other chassis component information. Such information may include activity, health, status and configuration information. Accordingly, a greater amount of information may be displayed on each server blade. Moreover, network configuration information may also be constantly displayed for observation by a user thus reducing the need to couple an external device in order to view such information.

Another technical advantage of particular embodiments includes the use of associated control keys in connection with an LCD positioned upon a chassis blade. This provides a user with the ability to control chassis operations such as component setup and configuration using the control keys and the LCD. Accordingly, labor expenses and service time with respect to the chassis components may be reduced.

Other technical advantages will be readily apparent to one skilled in the art from the following figures, descriptions and claims. Moreover, while specific advantages have been enumerated above, various embodiments may include all, some or none of the enumerated advantages.

BRIEF DESCRIPTION OF THE DRAWINGS

For a more complete understanding of particular embodiments of the invention and their advantages, reference is now made to the following descriptions, taken in conjunction with the accompanying drawings, in which.

DETAILED DESCRIPTION OF THE INVENTION

Figure 1:
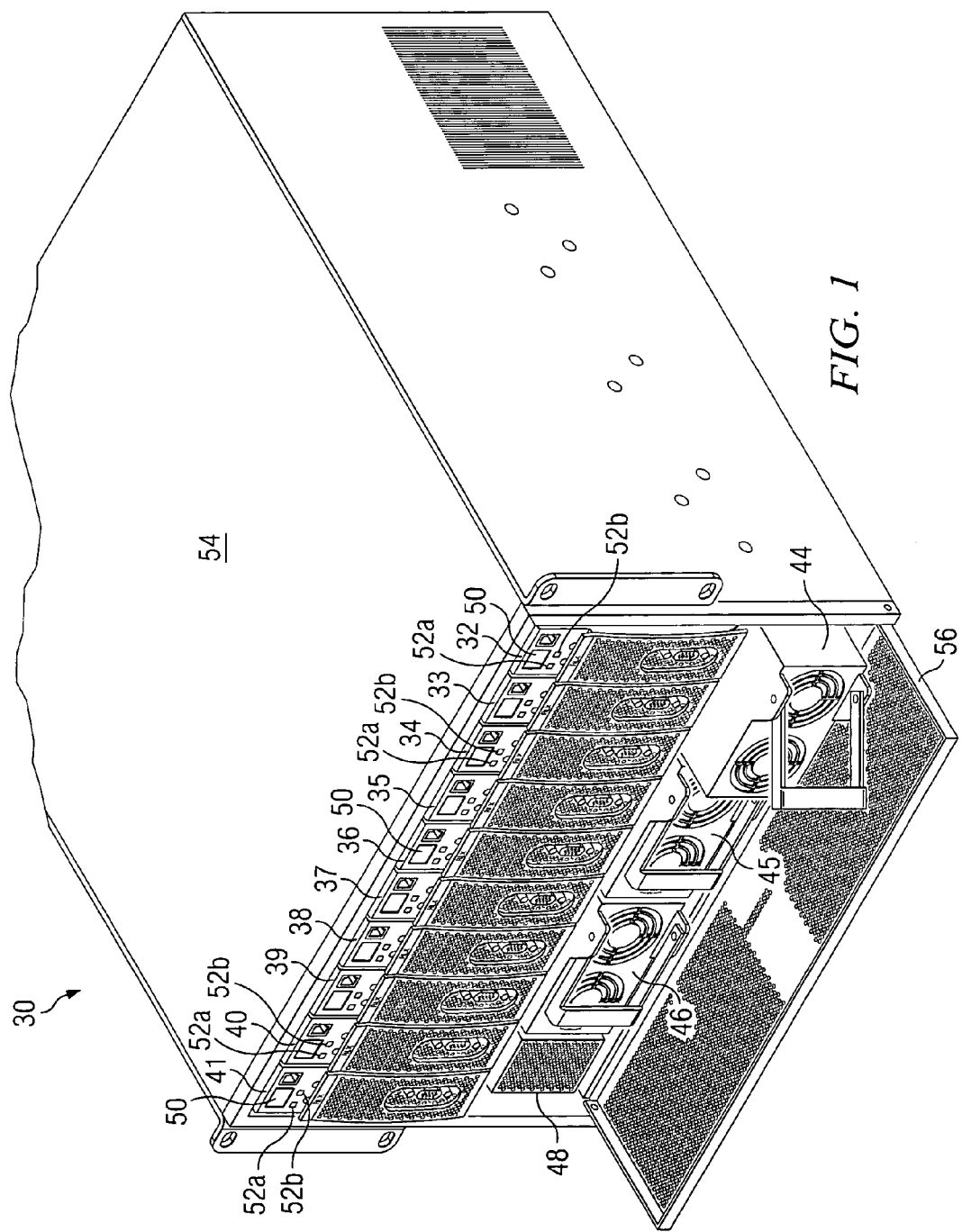
FIG. 1 illustrates a multiple server blade chassis, in accordance with a particular embodiment of the present invention.

FIG. 1 illustrates a multiple server blade chassis 30, in accordance with a particular embodiment of the present invention. Server blade chassis 30 includes a plurality of server blades 32-41. Server blade chassis 30 also includes a plurality of network interface cards to provide server blades 32-41 access to one or more communication networks, as further illustrated and discussed below with respect to FIG. 3.

In the illustrated embodiment, server chassis 30 is a 6U×28" chassis configured to receive up to ten server blades and provide access to a plurality of independent networks. The chassis size and number of server blades and/or network interface cards included with server blade chassis 30 may vary significantly within the teachings of the present invention. For purposes of this specification, a "blade" may include a card or other device comprising a printed circuit board and related components operable to be inserted into a chassis for coupling with other cards or network components.

Each server blade 32-41 includes a respective liquid crystal display (LCD) 50 and a plurality of associated control keys or buttons 52 for controlling the server blade and the LCD. Each LCD 50 is able to display information relating to its respective server blade. For example, in some embodiments an LCD 50 may be operable to display network configuration information such as internet protocol (IP) address and slot, rack or chassis identification or assignment information for its respective server blade and related network components. LCDs 50 may incorporate backlighting of various colors in certain situations to convey messages and server blade status to a user. In particular embodiments, control keys 52 may be used both to control the information displayed on LCDs 50 and to control and/or manage the operation of the server blades. Thus, LCDs 50 and associated control keys 52 provide a graphical, menu driven interface through which component information may be displayed and component operations may be controlled. Each LCD 50 and associated control keys 52 may be controlled by a respective processor, such as an embedded remote management module, of the component upon which the LCD is positioned. Providing server blade information on respective LCDs of each blade enables a user to monitor server blade status and network information and to control server blade and other chassis component operations without having to hook up a separate device such as a keyboard or monitor to the server blade. Moreover, the graphical, menu driven interface provides ease in understanding and use by a user. As discussed below, other chassis components may also utilize LCDs and associated control keys to display component information and to control component operations.

In particular embodiments, some chassis components such as server blades may include a light emitting diode (LED) in order to display network configuration information to an observer of the chassis. In such cases, the particular chassis component displaying such network configuration information may not include an LCD. As discussed above, network configuration information may include IP addresses of network components and rack, chassis and slot identifications and assignments.

Chassis 30 also includes a plurality of power supplies 44-46 positioned within chassis 30 below server blades 32-41. Power supplies 44-46 provide power to components of chassis 30. The illustrated embodiment includes three power supplies 44-46; however other embodiments may include a different number of power supplies. In particular embodiments, power supplies 44-46 may comprise three 1500 W power supplies providing up to 3000 W DC output in a 2+1 redundant configuration and three independent AC power connections for AC input redundancy. Chassis 30 includes a grill 48 next to power supplies 44-46 for inletting air to cool components of chassis 30, such as rear input/output blades.

Each server blade 32-41 and power supply 44-46 is at least partially enclosed within a box build 54. A hinged power supply door 56 is configured to enclose the power supplies within box build 54 and to provide access to the power supplies as needed for provisioning, service, maintenance and/or replacement. Box build 54 and power supply door 56, in combination, provide the ability to protect server blades 32-41, power supplies 44-46 and other chassis 30 components from ambient environment and/or damage.

Figure 2:
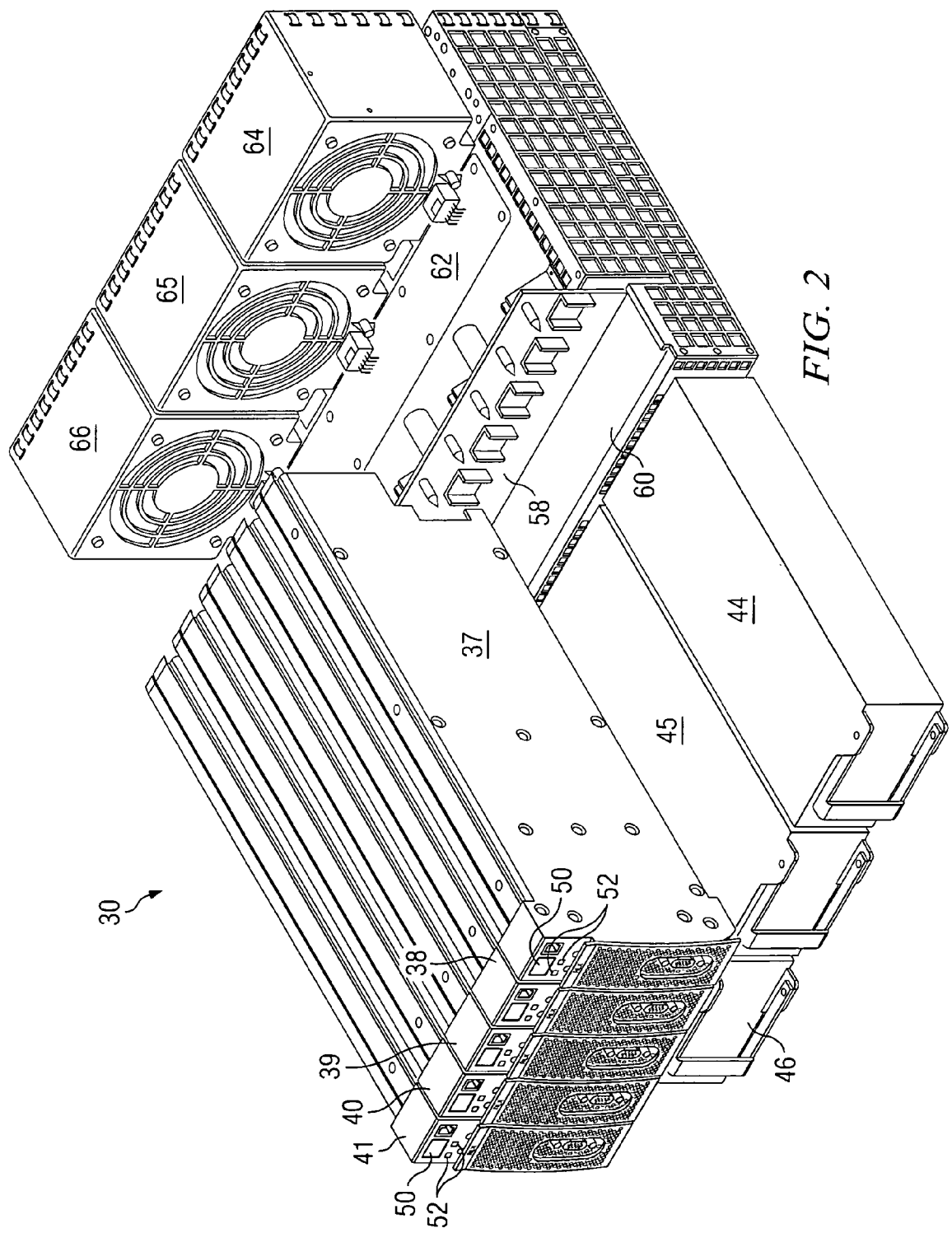
FIG. 2 illustrates the server blade chassis of FIG. 1 without an enclosing box build.

FIG. 2 illustrates server blade chassis 30 of FIG. 1 without an enclosing box build such that additional components may be illustrated. In FIG. 2, server blades 37-41 are coupled to a midplane 58 of chassis 30 through which power and connectivity passes. Power supplies 44-46 are coupled to a power plane 60 of chassis 30. Chassis 30 also includes cooling fan modules 64-66 to cool chassis server blades and other chassis components. Cooling fan modules 64-66 may be controlled by a chassis management blade through a fan control board 62 and may include one or more light emitting diodes (LEDs) to indicate fan module status. In particular embodiments, each cooling fan module 64-66 may include two cooling fans for redundancy. Chassis 30 includes three 120 mm cooling fan modules 64-66; however, other embodiments may include another number or type of cooling fan modules to cool server blades of a chassis.

Figure 3:
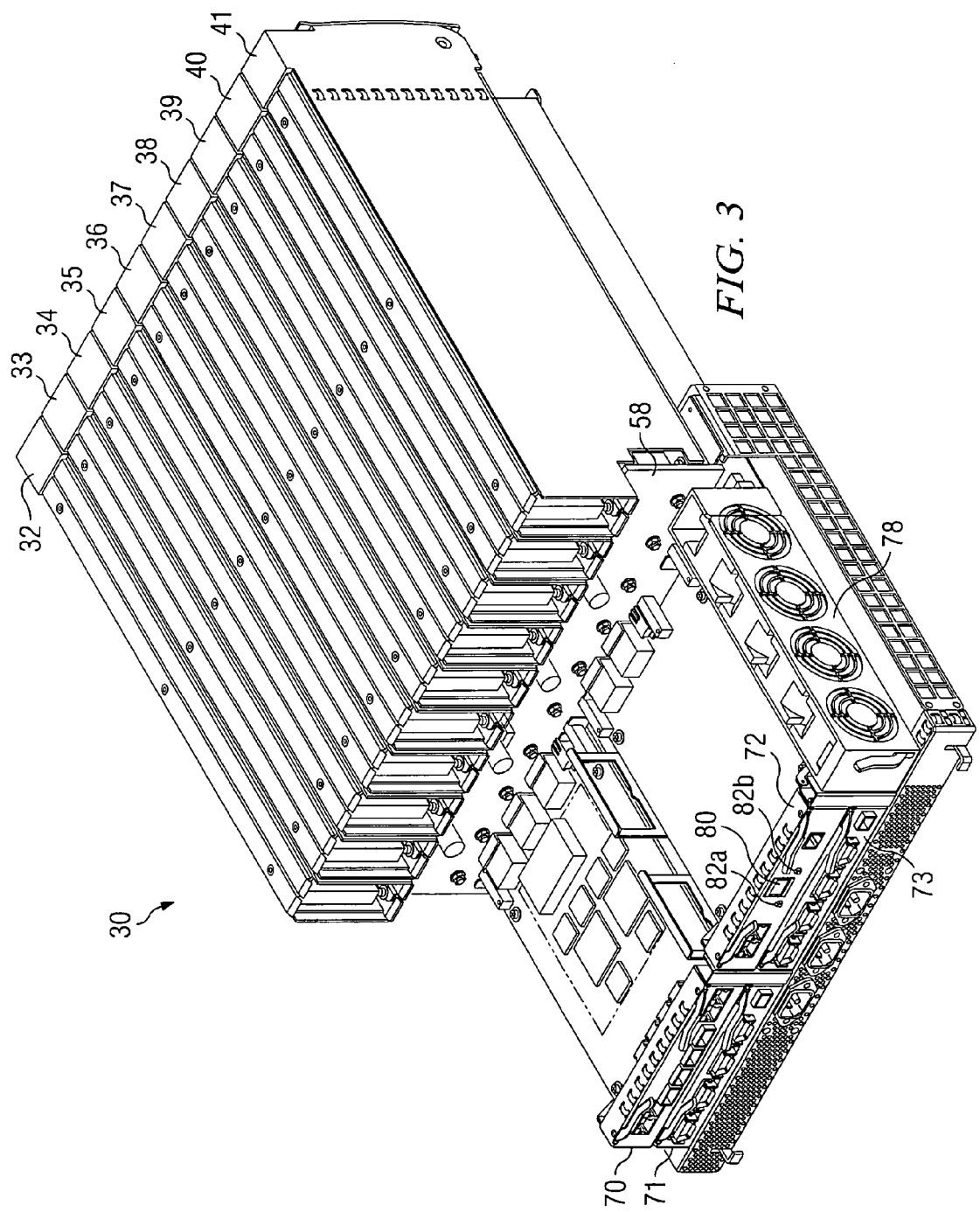
FIG. 3 illustrates the server blade chassis of FIG. 1 from a different angle.

FIG. 3 illustrates chassis 30 of FIG. 1 from a different angle, in accordance with a particular embodiment of the present invention. As illustrated, server blades 32-41 are each coupled to midplane 58. Chassis 30 includes rear blades 70-73 for coupling the server blades and other chassis components to one or more networks, external switches or other devices and for managing chassis 30 and its components. More specifically, the illustrated embodiment includes an ethernet switch 70, input/output (I/O) blades 71 and 73 and a chassis management blade 72. Other embodiments may include other types of rear blades providing other functionality for components of chassis 30. In this embodiment, chassis management blade 72 includes an LCD 80 and associated control keys 82 for controlling certain operations of chassis management blade 72 as further discussed below.

Chassis 30 also includes a network fan module 78 for cooling network cards 70-73. In particular embodiments, network fan module 78 may comprise a 60 mm fan module with four fans for redundancy. Network fan module 78 may be controlled by a chassis management blade and may include one or more LEDs to indicate fan module status.

Figure 4:
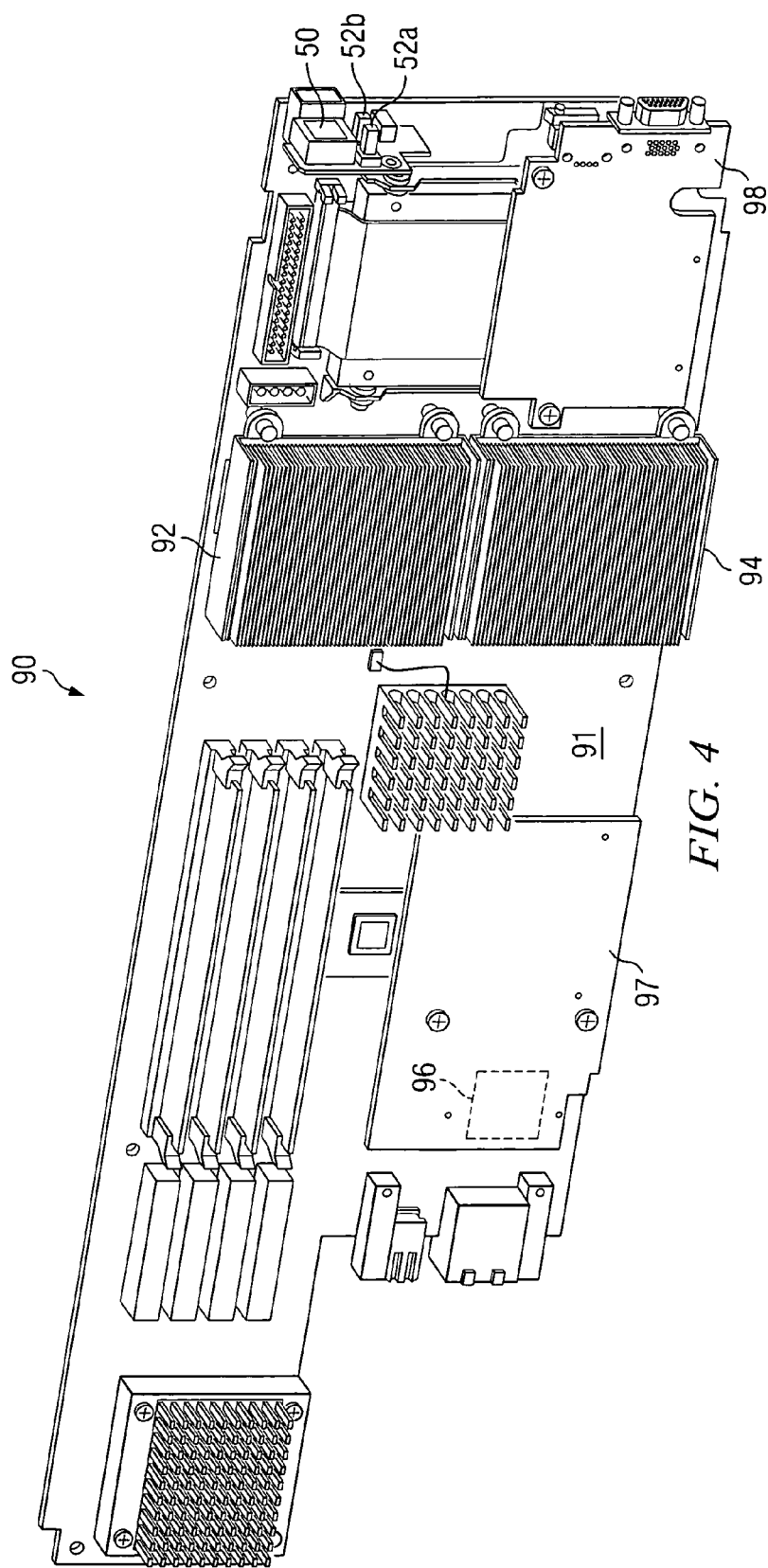
FIG. 4 illustrates a server blade, in accordance with a particular embodiment of the present invention.

FIG. 4 illustrates a server blade 90, in accordance with a particular embodiment of the present invention. Server blade 90 is similar in both configuration and function to server blades 32-41 described above. Server blade 90 is a single board computer upon which requisite components and devices may be coupled to enable blade 90 to function and operate as a server hosting a wide array of applications including, without limitation, Internet based applications. Server blade 90 is configured as a powerful computer which may be connected to the Internet and may be operable to store audio, video, data graphics and/or text files. Such files may be displayed to a user via protocols including, without limitation, hypertext transfer protocol (http).

Server blade 90 includes an LCD 50 and associated control keys 52 for displaying server blade status and information and for controlling functions of the server blade. As discussed above, LCD 50 and control keys 52 provide direct management of the component upon which it is positioned. Such direct management may include control of the component, such as reboot, reset and power control. Information relating to the component may also be displayed and controlled, such as status; temperatures; voltages; rack, chassis or slot assignment or configuration; boot progress; serial port functionality; or embedded remote management module IP information. For example, the information displayed may include the temperatures of a server blade, the temperature of any of its processors, its inlet air temperature and the voltage of the power supplies from which the blade receives its power. A user may scroll through this information by pressing control keys 52 associated with the LCD.

LCD 50 may be operable to display information in color. For example, in particular embodiments LCD 50 may display backlight colors indicating a certain status or message. For example, a green backlight may indicate a "good" status, an amber backlight may indicate a "warning" status and a red backlight may indicate a "failure" status. In some embodiments, the backlight color may blink upon certain events such as activity within the particular component represented by the LCD.

The control keys associated with the LCD may be used to control the blade server when the LCD displays a particular status such as a "warning" message. For example, if a "warning" message is displayed (through backlight color or otherwise) and the server blade or other component that is the subject of the warning message thus needs to be shut down, then a user may use the control keys to get to a menu displayed by the LCD that displays shut down options such as gentle shut down, hard reset or power off.

LCD 50 may also graphically display various devices of a component, such as a blade server, on which the LCD is positioned. Such devices may include network interfaces and hard drives of a blade server. The devices may be displayed as icons on the LCD such that the devices may not need separate LEDs to indicate status and/or activity. Activity of a device may be indicated on the LCD, for example, by a blinking icon representing the device or by blinking an LCD backlight. If a device is turned off then its icon may be removed from the LCD screen.

In particular embodiments, LCDs as described herein use standby power to display information such that the particular component on which the LCD is positioned, does not have to be powered up in order for the LCD to display information. Thus, a blade server or other component may consume little or no power outside of that consumed by a management processor and the LCD.

Server blade 90 includes a printed circuit board (PCB) 91 coupled with central processing units (CPUs) 92 and 94. Server blade 90 also includes a management processor 96 positioned under a peripheral component interconnect (PCI) mezzanine card 97. Management processor 96 manages LCD 50 and control keys 52. Management processor 96 may be accessed by a user through control keys 52 (using LCD 50 as a display) to obtain server blade and network information and to control server blade 90 and related chassis components.

In the illustrated embodiment, management processor 96 is operationally distinct from a main processor of server blade 90, such as one of CPUs 92 or 94. The use of a separate management processor for each server blade separate from a typical, main server blade CPU enables display of information and control of certain blade functions even when the blade main CPU is down or powered off. This functionality may be accomplished by management processor 96 and the blade main CPU receiving their power through separate power feeds. Such power feeds may come from different power sources. In particular embodiments, management processor 96 and the blade main CPU may receive their power from separate feeds coming from the same power source. Standby power may be used to power LCD 50 and management processor 96 through a separate power feed from that feeding the blade main CPU, even when the blade main CPU is inactive. In particular embodiments, management processor 96 may comprise an embedded remote management module 100 Mb NIC. Server blade 90 may also include other components in accordance with particular needs, such as a power regulator module, a hard disk, a network interface card (NIC) and various connectors.

Server blade 90 also includes a video graphics array (VGA) card 98 with a universal serial bus (USB) port. VGA card 98 provides a video output for server blade 90 to output video including chassis component information to an external display, such as an external monitor. Such output video may comprise video that may otherwise be displayed on an LCD positioned upon the card as described herein. In particular embodiments, VGA card 98 may be controlled and driven by management processor 96. Other chassis components, such as a chassis management blade, may similarly comprise a video output for display upon of external display of information which may otherwise be displayed on an LCD positioned upon the chassis component.

Figure 5:
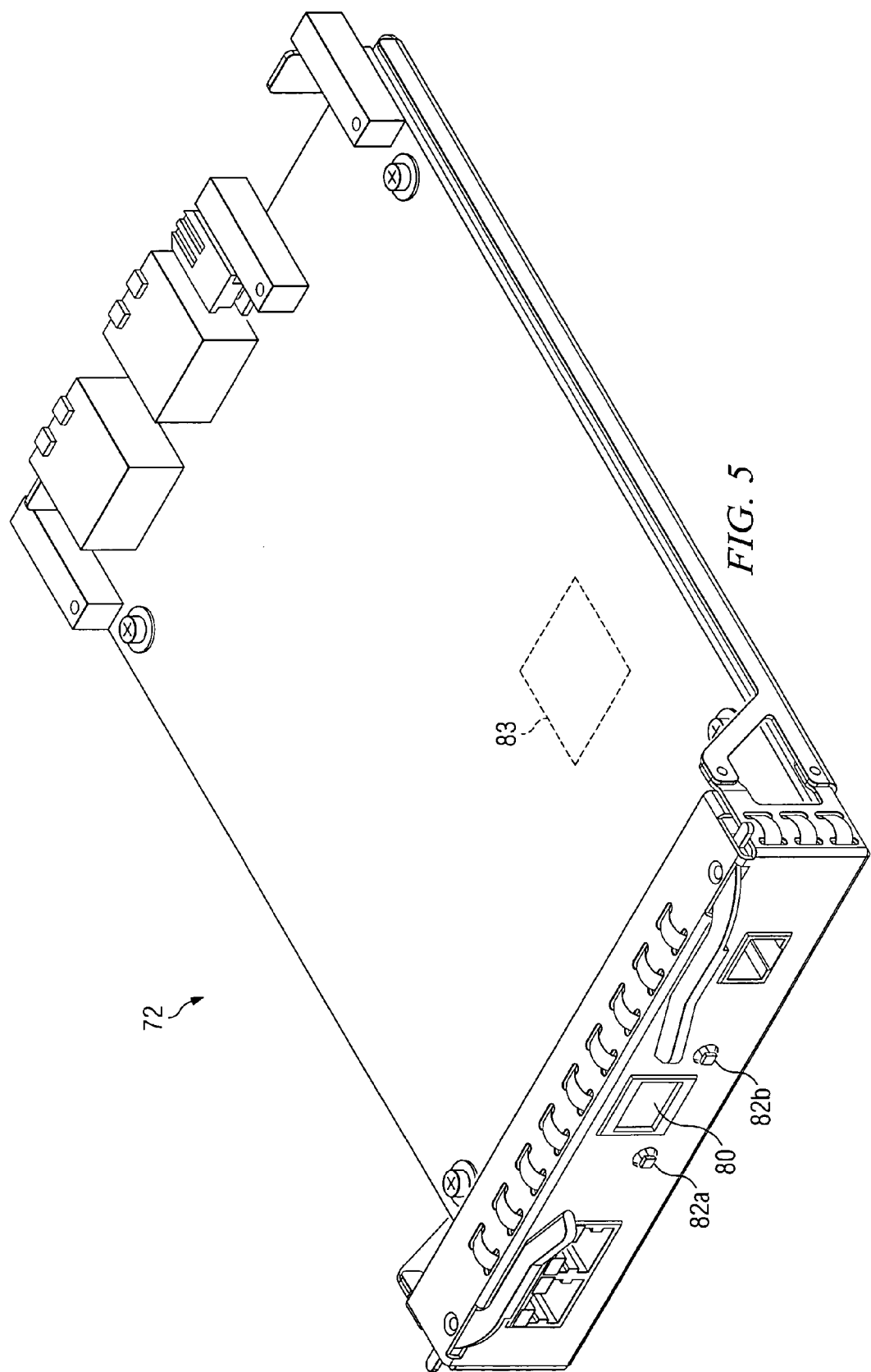
FIG. 5 illustrates a chassis management blade, in accordance with a particular embodiment of the present invention.

FIG. 5 illustrates chassis management blade 72 of FIG. 3, in accordance with a particular embodiment. Chassis management blade 72 provides management of ethernet switch fabric within chassis 30 and may include ports, jacks or other connectors for coupling to chassis components, such as server blade management NICs. As mentioned above, chassis management blade 72 includes LCD 80 and associated control keys 82 that may provide similar functionality relating to management blade 72 as LCDs 50 and associated control keys 52 provide for server blades described above. Chassis management blade also includes a management processor 83 that controls functions and operation of LCD 80 and control keys 82. LCD 80 displays information relating to chassis 30, such as status of the power supplies and fans and related voltages. LCD 80 may also display alerts such as warning messages regarding the operation of chassis 30 and its components. LCD 80 may be used in connection with control keys 82 to manage the operation of chassis 30. Such management may include assigning and maintaining rack and/or chassis identification.

LCDs of server blades, chassis management blades and other components may be any suitable shape or size. In particular embodiments, such LCDs may comprise a 36×24 pixel LCD and may comprise a viewing area of approximately 14 mm×11 mm (e.g., 13.9 mm×10.6 mm in some embodiments).

In particular embodiments, network configuration information associated with NICs on a host computer are collected periodically by a software agent running on the host computer. This process monitors each NIC independently for changes in its network configuration parameters. The current network configuration state of each NIC may be reported via an "out-of-band" (meaning that this reporting mechanism has no networking dependency) mechanism to an agent/controller which is accessible independently from the host computer. As an example of this, the software process could report the network configuration state of the host computer's NICs to a baseboard management controller (BMC) as defined in the intelligent platform management interface (IPMI) specification via the keyboard controller style (KCS) or server management interface chip (SMIC) interface. Once resident on the agent/controller (e.g., BMC) this information would then be displayed on a physically-viewable device (e.g., LCD) or reported in response to a remote query from an external system. The software agent would be able to distinguish and report the distinction between configured/available network interfaces and unconfigured/unavailable network interfaces.

Figure 6:
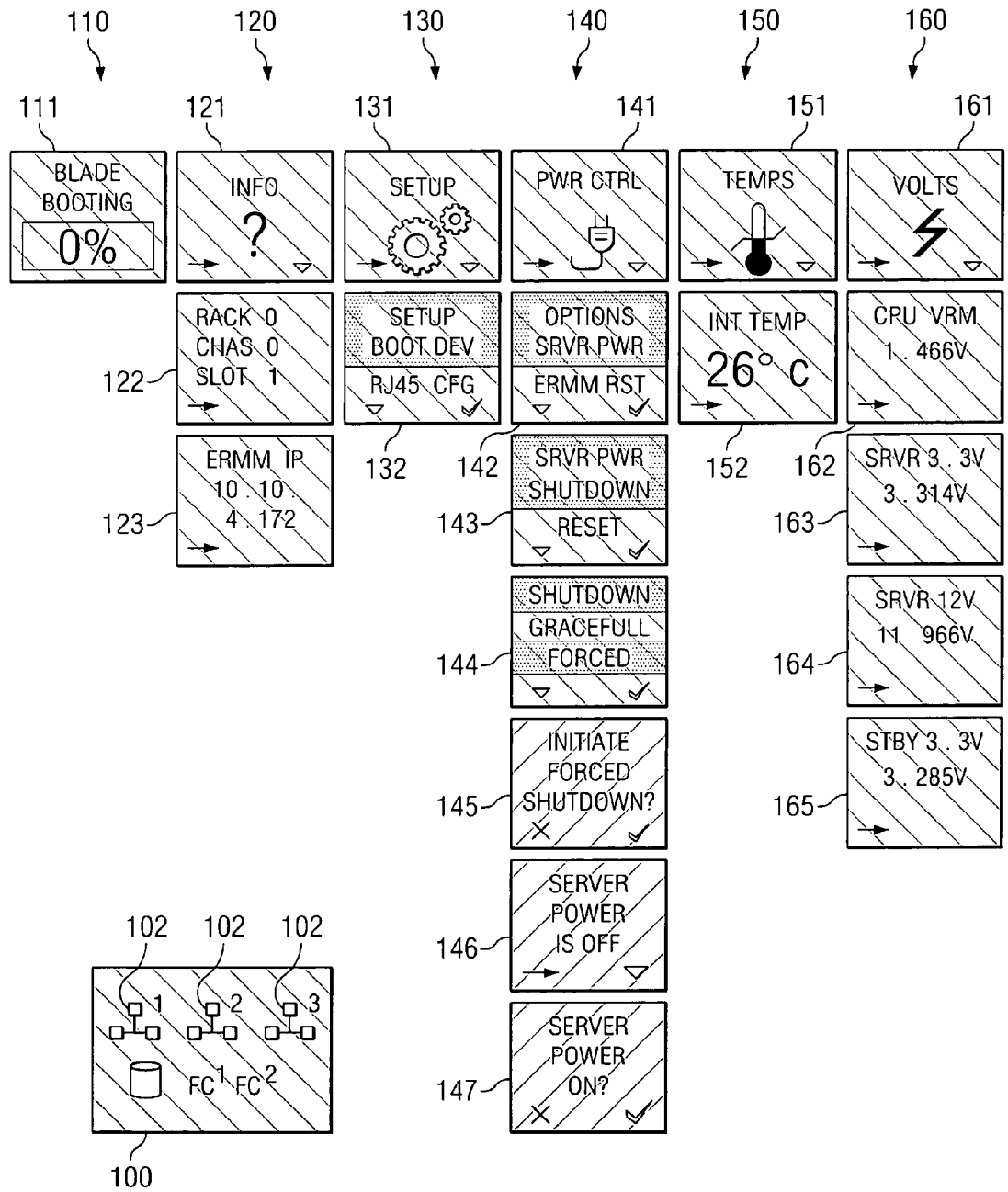
FIG. 6 illustrates example screens of a liquid crystal display of a chassis component, in accordance with particular embodiments of the present invention.

FIG. 6 illustrates example screens that may be displayed by LCDs positioned upon server blades or other chassis components, in accordance with particular embodiments of the present invention. Screen 100 is an example activity screen with icons 102 representing connection or activity with respect to various networks. "FC¹" and "FC²" may represent optional I/O cards plugged into the chassis midplane and thus connected with the particular server blade on which the LCD is positioned.

Columns 110, 120, 130, 140, 150 and 160 display example screens of an LCD through which a user may navigate to display certain component information and to control certain component operations. Such navigation may be accomplished through the control keys associated with the LCD. In the illustrated examples, the top screens of each column (screens 111, 121, 131, 141, 151 and 161) show high level category screens which may be cycled through to display and provide more specific information and functionality with respect to each high level category.

Column 110 includes screen 111 which displays progress of a boot of the server blade upon which the LCD is positioned. Column 120 includes informational screens 121-123 that display configuration and assignment information with respect to a server blade, its chassis, and the rack in which the chassis may be positioned. Screen 123 displays IP information of an embedded remote management module. Column 130 includes screens 131 and 132 that display setup information and provide setup configuration and boot functionality for the server blade or chassis component upon which the LCD is positioned. Such setup configuration may include inputting rack, chassis and slot assignments and identifications.

Column 140 includes screens 141-147 through which a user may navigate to receive power information and to control power functionality. A user may turn off a server blade on which the LCD is positioned or may control power to other components using such screens. As illustrated, a user may have options as to the type of power shutdown the user may implement (e.g., "gracefull" or "forced"). Column 150 includes screens 151 and 152 that display temperature information of the component on which the LCD is positioned. In particular embodiments, the LCD may display temperature information relating to other chassis components as well. The temperatures of such components may also be controlled through the control keys associated with the LCD. Column 160 includes screens 161-165 that display voltage information of server blade components and other chassis components.

It should be understood that the screens illustrated in FIG. 6 are mere examples of the types of information that an LCD may display and that may be controlled through an LCD and associated control keys. Color and shading may be used in the LCD display, for example, both in fonts and backlights displayed by the LCD to indicate certain messages and/or information. LCDs may be positioned upon any of a number of chassis components, such as server blades or a chassis management blade, and may display information and provide functionality relating to the particular component on which the LCD is positioned or other chassis or coupled network components.

Although the present invention has been described in detail with reference to particular embodiments, it should be understood that various other changes, substitutions, and alterations may be made hereto without departing from the spirit and scope of the present invention. For example, although the present invention has been described with reference to a number of elements included within a server chassis, a server blade and other chassis components, these elements may be combined, rearranged or positioned in order to accommodate particular routing architectures or needs. In addition, any of these elements may be provided as separate external components where appropriate. The present invention contemplates great flexibility in the arrangement of these elements as well as their internal components.

Numerous other changes, substitutions, variations, alterations and modifications may be ascertained by those skilled in the art and it is intended that the present invention encompass all such changes, substitutions, variations, alterations and modifications as falling within the spirit and scope of the appended claims. Moreover, the present invention is not intended to be limited in any way by any statement in the specification that is not otherwise reflected in the claims.

What is claimed is:

1. A system for displaying chassis component information, comprising:
   a chassis;
   a plurality of server blades each coupled to the chassis; and each server blade comprising:
   a respective liquid crystal display (LCD) positioned upon the server blade, the respective LCD operable to display chassis component information;
   a main processor; and
   a management processor that drives the respective LCD, the management processor being operationally distinct from the main processor such that the main processor is inactive during operation of the respective LCD.

2. The system of claim 1, wherein the chassis component information comprises server blade information of the server blade upon which the respective LCD is positioned.

3. The system of claim 2, wherein the server blade information comprises an IP address of the server blade.

4. The system of claim 2, wherein the server blade information comprises at least one selected from the group consisting of slot assignment, chassis assignment, rack assignment and IP address information.

5. The system of claim 1, wherein the respective LCD is operable to display chassis component information in color to indicate a message.

6. The system of claim 1, wherein the chassis component information comprises chassis component activity information.

7. The system of claim 1, wherein the chassis component information comprises at least one of temperature information and voltage information.

8. The system of claim 1, wherein each server blade further comprises at least one respective control key associated with the respective LCD, the at least one respective control key operable to provide operational control of at least one chassis component.

9. The system of claim 8, wherein the at least one chassis component comprises the server blade of the at least one respective control key.

10. The system of claim 8, wherein the operational control comprises setup control of the server blade of the at least one respective control key.

11. The system of claim 8, wherein the operational control comprises power control of the server blade of the at least one respective control key.

12. The system of claim 1, wherein each server blade further comprises: a respective video output operable to output the chassis component information to an external display, the management processor operable to drive the respective video output.

13. The system of claim 1, wherein the respective LCD comprises a viewing area of approximately 14 mm×11 mm.

14. A system for displaying chassis component information, comprising:

a chassis;

a plurality of server blades stacked in and coupled to the chassis;

a housing enclosing the chassis and the plurality of server blades;

each of the plurality of server blades comprising a liquid crystal display (LCD) operable to display chassis component information; a main processor; and a management processor that drives the respective LCD, the management processor being operationally distinct from the main processor such that the main processor is inactive during operation of the respective LCD, wherein each of the plurality of server blades comprises a chassis management blade operable to manage switch fabric of the chassis and the chassis component information includes an IP address of the chassis management blade.

15. The system of claim 14, wherein the chassis component information comprises chassis component activity information.

16. The system of claim 14, wherein the chassis component information comprises at least one selected from the group consisting of slot assignment, chassis assignment, rack assignment and IP address information.

17. The system of claim 14, wherein the chassis management blade further comprises at least one control key associated with the LCD, the at least one control key operable to provide operational control of at least one chassis component.

18. The system of claim 17, wherein the operational control comprises setup control of at least one chassis component.

19. The system of claim 17, wherein the operational control comprises power control of at least one chassis component.

20. The system of claim 17, wherein the at least one chassis component comprises at least one chassis cooling fan.

21. The system of claim 14, wherein each of the plurality of server blades comprises a network interface card.

22. A system for displaying chassis component information, comprising:

a chassis;

a plurality of server blades each coupled to the chassis;

a housing enclosing the plurality of server blades and the chassis;

each server blade comprising a respective display device positioned upon the server blade; the respective display device operable to display network configuration information with respect to the server blade; a main processor; and a management processor that drives the respective display device, the management processor being operationally distinct from the main processor such that the main processor is inactive during operation of the respective display device, wherein the network configuration information comprises an IP address of the server blade.

23. The system of claim 22, wherein the respective display device comprises at least one light emitting diode (LED).

24. The system of claim 22, wherein the respective display device comprises a liquid crystal display (LCD).

25. A method for displaying chassis component information, comprising:

providing a chassis;

coupling a plurality of server blades to the chassis;

displaying chassis component information that includes an IP address of the server blade on respective liquid crystal displays (LCDs) positioned upon each server blade; a main processor; and a management processor that drives the respective LCD, the management processor being operationally distinct from the main processor such that the main processor is inactive during operation of the respective LCD.

26. The method of claim 25, wherein displaying chassis component information comprises displaying server blade information of the server blades upon which the respective LCDs are positioned.

27. The method of claim 26, wherein displaying server blade information comprises displaying at least one selected from the group consisting of slot assignment, chassis assignment, and rack assignment.

28. The method of claim 25, wherein displaying chassis component information comprises displaying chassis component information in color to indicate a message.

29. The method of claim 25, wherein displaying chassis component information comprises displaying chassis component activity information.

30. The method of claim 25, wherein displaying chassis component information comprises displaying at least one of temperature information and voltage information.

31. The method of claim 25, further comprising providing operational control of at least one chassis component with at least one respective control key of each server blade, the at least one respective control key associated with the respective LCD of the server blade.

32. The method of claim 31, wherein providing operational control of at least one chassis component comprises providing operational control of the server blade of the at least one respective control key.

33. The method of claim 31, wherein providing operational control of at least one chassis component comprises providing setup control of the server blade of the at least one respective control key.

34. The method of claim 31, wherein providing operational control of at least one chassis component comprises providing power control of the server blade of the at least one respective control key.

35. The method of claim 25, further comprising:

outputting to an external display the chassis component information with a respective video output of each server blade; and driving the respective video output with a respective management processor of each server blade, the respective management processor operationally distinct from a respective main processor of the server blade such that the respective main processor may be inactive during output of the chassis component information to the external display.

36. The method of claim 25, wherein the respective LCD comprises a viewing area of approximately 14 mm×11 mm.

37. A method for displaying chassis component information, comprising:

providing a chassis;

coupling a plurality of stacked server blades to the chassis;

displaying chassis component information on a liquid crystal display (LCD) positioned upon each of the plurality of server blades; and driving the LCD with a management processor of the chassis management blade, the management processor being operationally distinct from a main processor of the chassis management blade such that the main processor may be inactive during operation of the LCD.

38. The method of claim 37, wherein displaying chassis component information on an LCD positioned upon each of the plurality of server blades comprises displaying chassis component information on an LCD positioned upon a chassis management blade operable to manage switch fabric of the chassis.

39. The method of claim 38, wherein displaying chassis component information comprises displaying chassis component activity information.

40. The method of claim 38, wherein displaying chassis component information comprises displaying an IP address of the chassis management blade.

41. The method of claim 38, wherein displaying chassis component information comprises displaying at least one selected from the group consisting of slot assignment, chassis assignment, rack assignment and IP address information.

42. The method of claim 38, further comprising providing operational control of at least one chassis component with at least one control key of the chassis management blade, the at least one control key associated with the LCD.

43. The method of claim 42, wherein providing operational control of at least one chassis component comprises providing setup control of at least one chassis component.

44. The method of claim 42, wherein providing operational control of at least one chassis component comprises providing power control of at least one chassis component.

45. The method of claim 42, wherein providing operational control of at least one chassis component comprises providing operational control of at least one chassis cooling fan.

46. The method of claim 37, wherein each of the plurality of server blades comprises a network interface card.

47. A method for displaying chassis component information, comprising:
providing a chassis;
coupling a plurality of server blades to the chassis;
enclosing the plurality of server blades and the chassis in a housing;
displaying network configuration information on a respective display device positioned upon each server blade, wherein displaying network configuration information comprises displaying an IP address of the server blade; a main processor; and a management processor that drives the respective display device, the management processor being operationally distinct from the main processor such that the main processor is inactive during operation of the respective display device upon which the respective display device is positioned.

48. The method of claim 47, wherein displaying network configuration information on a respective display device comprises displaying network configuration information on at least one respective light emitting diode (LED).

49. The method of claim 47, wherein displaying network configuration information on a respective display device comprises displaying network configuration information on at least one respective liquid crystal display (LCD).

50. A system for displaying server blade information, comprising:
a plurality of server blades at least partially enclosed in box build with each server blade including:
a liquid crystal display (LCD) positioned upon the server blade, the LCD operable to display server blade information; and
a management processor operable to drive the LCD, the management processor being operationally distinct from a main processor of the server blade such that the main processor may be inactive during operation of the LCD.

51. The system of claim 50, wherein the server blade information comprises an IP address of the server blade.

52. The system of claim 50, wherein the server blade information comprises at least one selected from the group consisting of slot assignment, chassis assignment, rack assignment and IP address information.

53. The system of claim 50, wherein the server blade information comprises at least one of temperature information and voltage information.

54. The system of claim 50, wherein the server blade comprises at least one respective control key associated with the LCD, the at least one respective control key operable to provide operational control of the server blade.

55. The system of claim 54, wherein the operational control comprises setup control of the server blade.

56. The system of claim 54, wherein the operational control comprises power control of the server blade.

57. The system of claim 50, wherein the LCD comprises a viewing area of approximately 14 mm×11 mm.

58. A system for displaying chassis component information, comprising:
a chassis;
a plurality of server blades each coupled to a midplane of the chassis; and
each server blade comprising:
a respective liquid crystal display (LCD) positioned upon the server blade, the respective LCD operable to display:
an IP address of the server blade upon which the respective LCD is positioned;
chassis component activity information in color to indicate a message;
temperature information of at least one chassis component;
voltage information of at least one chassis component; and
at least one respective control key associated with the respective LCD, the at least one respective control key; a main processor; and a management processor that drives the respective display device, the management processor being operationally distinct from the main processor such that the main processor is inactive during operation of the respective display device operable to provide setup control and power control of the server blade of the at least one respective control key.

59. The system of claim 58, wherein the respective LCD comprises a viewing area of approximately 14 mm×11 mm.

60. The system of claim 58, further comprising:
a chassis management blade coupled to the midplane of the chassis;
the chassis management blade operable to manage switch fabric of the chassis; and
the chassis management blade comprising:
an LCD positioned upon the chassis management blade, the LCD operable to display at least one selected from the group consisting of slot assignment, rack assignment, chassis assignment and IP address information; and
at least one control key associated with the LCD, the at least one control key operable to provide setup control and power control of at least one chassis component.

* * * * *

UNITED STATES PATENT AND TRADEMARK OFFICE
CERTIFICATE OF CORRECTION

PATENT NO.       : 7,738,242 B2                                                                 Page 1 of 1
APPLICATION NO.  : 10/754804
DATED            : June 15, 2010
INVENTOR(S)      : Montgomery C. McGraw et al.

It is certified that error appears in the above-identified patent and that said Letters Patent is hereby corrected as shown below:

In column 9, line 44, in Claim 22, delete "blade;" and insert -- blade, --, therefor.

In column 12, line 37-45, in Claim 58, delete "at least one respective control key associated with the respective LCD, the at least one respective control key; a main processor; and a management processor that drives the respective display device, the management processor being operationally distinct from the main processor such that the main processor is inactive during operation of the respective display device operable to provide setup control and power control of the server blade of the at least one respective control key."
and insert -- at least one respective control key associated with the respective LCD, the at least one respective control key operable to provide setup control and power control of the server blade of the at least one respective control key; a main processor; and a management processor that drives the respective display device, the management processor being operationally distinct from the main processor such that the main processor is inactive during operation of the respective display device. --, therefor.

Signed and Sealed this

Ninth Day of November, 2010

David J. Kappos
*Director of the United States Patent and Trademark Office*